Figure 1:
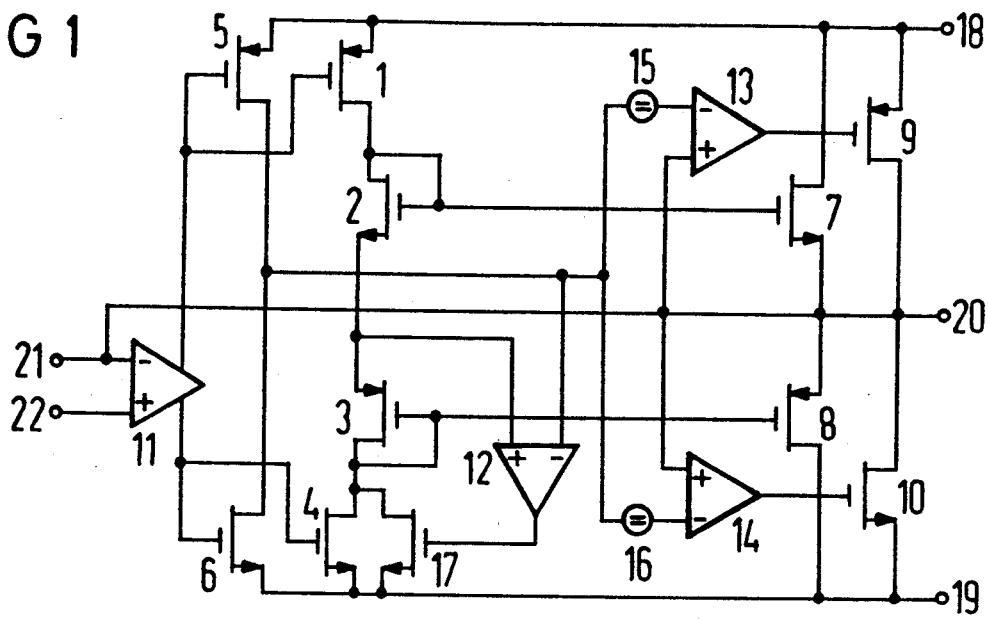

United States Patent [19]

Koch et al.

[11] Patent Number: 5,210,506
[45] Date of Patent: May 11, 1993

[54] LARGE SWING OUTPUT BUFFER AMPLIFIER

[75] Inventors: Rudolf Koch, Unterhaching; Fritz Mistlberger, Moosburg, both of Fed. Rep. of Germany

[73] Assignee: Siemens Aktiengesellschaft, Munich, Fed. Rep. of Germany

[21] Appl. No.: 869,474

[22] Filed: Apr. 15, 1992

[30] Foreign Application Priority Data

Apr. 16, 1991 [EP] European Pat. Off. ........ 91106068.9

[51] Int. Cl.[5] .......................................... H03F 3/45
[52] U.S. Cl. .................................... 330/255; 330/253; 330/264
[58] Field of Search ............... 330/253, 255, 257, 260, 330/263, 264, 269

[56] References Cited

U.S. PATENT DOCUMENTS

| | | | |
|---|---|---|---|
| 4,464,634 | 8/1984 | Velazquez | 330/264 |
| 4,739,281 | 4/1988 | Doyle | 330/253 |
| 4,888,559 | 12/1989 | Sevenhans et al. | 330/264 |
| 4,963,837 | 10/1990 | Dedic | 330/264 |
| 4,973,916 | 11/1990 | Baik | 330/264 |
| 5,097,233 | 3/1992 | Alexander | 330/255 |

FOREIGN PATENT DOCUMENTS 0406964  1/1991  European Pat. Off. .

OTHER PUBLICATIONS

IEEE Journal of Solid-State Circuits, vol. 24, No. 1, Feb. 1989, Nagaraj pp. 181-183.
IEEE Journal of Solid-State Circuits, vol. SC-18, No. 6, Dec. 1983, Brehmer et al., pp. 624-629.
IEEE Journal of Solid-State Circuits vol. SC-19, No. 6, Dec. 1984; Ahuja et al., pp. 892-899.
IEEE Journal of Solid-State Circuits vol. SC-20, No. 6, Dec. 1985, Fisher, pp. 1200-1205.

Primary Examiner—Robert J. Pascal
Assistant Examiner—Tan Dinh
Attorney, Agent, or Firm—Herbert L. Lerner; Laurence A. Greenberg

[57] ABSTRACT

An output buffer amplifier includes one end stage for small output capacities and one end stage for large output capacities. The end stages have outputs being connected to one another. A control stage is connected upstream of the end stage for small output capacities. The control stage has one input being triggered by a signal proportional to an input signal of the end stage for large output capacities and another input being triggered by a signal proportional to an output signal of the end stage for small output capacities.

23 Claims, 1 Drawing Sheet

LARGE SWING OUTPUT BUFFER AMPLIFIER

The invention relates to an output buffer amplifier.

In analog signal processing, output buffer amplifiers are needed for many applications, such as to drive earphones and loudspeakers in end-user telephone equipment. The demands made on an output buffer amplifier in such a case include the capability of driving low-ohmic loads, sometimes with a high capacitive component, a large output signal rise up to near the operating voltage, adequate linearity without takeover distortion, and only slight resting current consumption. Conventional output buffer amplifiers are constructed as end stages of class AB in CMOS technology, and they have two drain-coupled complementary MOS transistors. The two MOS transistors are triggered by error or fault amplifiers, which are each fed back from the coupled drain terminals of the two MOS transistors to one input of the error amplifier. Such output buffer amplifiers are, for instance, known from a paper by K. E. Brehmer and a J. B. Wieser entitled "Large Swing CMOS Power Amplifier", in IEEE Journal of Solid-State Circuits, Vol. SC-18, No. 6, Dec. 1983, pp. 624-629; a paper by B. K. Ahuja, P. R. Gray, W. M. Baxter and G. T. Uehara, entitled "A Programmable CMOS Dual-Channel Interface Processor for Telecommunications Applications", in IEEE Journal of Solid-State Circuits, Vol. SC-19, pp. 892-899, December 1984; and a paper by J. A. Fisher, entitled "A High-Performance CMOS Power Amplifier", in IEEE Journal of Solid-State Circuits, Vol. SC-20, No. 6, Dec. 1985, pp. 1200-1205.

The advantage of drain-coupled end stages is that the output signal swing is greater than with simple source-coupled end stages, where high gate-to-source voltages of the output transistors severely limit the signal swing. One problem in drain-coupled end stages is generally the occurrence of different offset voltages and the two error amplifiers, which lead to major deviations in the resting current. In the practical application of that circuit concept, additional effort and expense are therefore necessary to monitor the resting current.

In the J. A. Fisher paper "A High-Performance CMOS Power Amplifier" in IEEE Journal of Solid-State Circuits, Vol. SC-20, No. 6, Dec. 1985, pp. 1200-1205, an output buffer amplifier is shown that combines two end stages, namely one source-coupled end stage and another source-coupled end stage. Major output capacities are then primarily through the drain-coupled end stage. At low output capacities, for instance in the range of the resting current of the drain-coupled end stage, the end stage is out of operation because of offset voltage sources preceding it. The output capacity is then brought to bear solely by the source-coupled end stage. For that operating case, the resting current can be adjusted exactly by suitable dimensioning of the MOS transistors. The source-coupled end stage additionally reduces phase displacements brought about by the error amplifier, because the drain-coupled end stage bypasses them for high frequencies.

However, one problem with that circuit is that two diodes in an input stage provided for triggering the end stages are needed in order to generate the bias voltage of the typical source follower stage. The voltages dropping at the two diodes severely limit the output voltage swing of the total output buffer amplifier. Particularly with a CMOS structure, the voltage drop at the two diodes effects a limitation of the output voltage swing of at least 2 V. In the case of output buffer amplifiers with a supply voltage of 5 V, that is a considerable restriction of the operating range.

In a paper by K. Nagaraj, entitled "Large-Swing CMOS Buffer Amplifier", in IEEE Journal of Solid-State Circuits, Vol. 24, No. 1, Feb. 1989, one possibility for improving the output voltage swing in the above-described circuit is shown. To that end, two complementary MOS transistors are additionally provided which enable raising or lowering the potential at the pickup of the two series-connected diodes up to near both supply potentials. Consequently, the output signal swing of the output buffer amplifier increases accordingly as well.

However, the disadvantage of the last-mentioned circuit is that because of the additional complementary MOS transistors, the MOS transistors used in the input stage besides the two diodes are operated in the triode range in certain modulation ranges, which has the overall result of increasing distortion in the output buffer amplifier.

It is accordingly an object of the invention to provide a large swing buffer amplifier, which overcomes the hereinafore-mentioned disadvantages of the heretofore-known devices of this general type.

With the foregoing and other objects in view there is provided, in accordance with the invention, an output buffer amplifier, comprising one end stage for small output capacities, one end stage for large output capacities, the end stages having outputs being connected to one another; and a control stage connected upstream of the end stage for small output capacities, the control stage having one input being triggered by a signal proportional to an input signal of the end stage for large output capacities and another input being triggered by a signal proportional to an output signal of the end stage for small output capacities.

In accordance with another feature of the invention, the control stage has a differential amplifier.

In accordance with a further feature of the invention, the end stage for large output capacities has two drain-coupled complementary MOS output transistors with gate terminals, two fed-back error amplifiers each being connected upstream of a respective one of the gate terminals of the complementary MOS output transistors and each having inputs, and offset voltage sources each being connected upstream of a respective one of the inputs of the error amplifiers for coupling the inputs of the error amplifiers to one another.

In accordance with an added feature of the invention, the end stage for large output capacities has two drain-coupled MOS input transistors with gate terminals to which an input signal is applied.

In accordance with an additional feature of the invention, the error amplifiers are fed-back from the coupled drain terminals of the complementary MOS output transistors to inputs of the error amplifiers.

In accordance with yet another feature of the invention, the end stage for small output capacities has two source-coupled complementary MOS output transistors.

In accordance with yet a further feature of the invention, the end stage for small output capacities has a series circuit of diodes with a pickup, and two complementary MOS input transistors having drain terminals being coupled in the conducting direction through the series circuit of diodes and gate terminals to which an input signal is applied, and the pickup of the series circuit of diodes carries a signal proportional to an output signal of the end stage for small output capacities.

In accordance with yet an added feature of the invention, there are provided complementary MOS input transistors having drain terminals, and additional MOS transistors each being connected to the drain terminal of a respective one of the MOS input transistors of the same conduction type, forming cascade stages, the additional MOS transistors having gate terminals connected to bias potentials.

In accordance with yet an additional feature of the invention, there is provided an MOS trigger transistor having a gate terminal and a drain-to-source path, the end stage for small output capacities having MOS input transistors with drain-to-source paths, the control stage being a control amplifier having an output coupled through the MOS trigger transistor to the end stage for small output capacities, the gate terminal of the MOS trigger transistor being connected to the output of the control amplifier and the drain-to-source path of the MOS trigger transistor being connected parallel to the drain-to-source path of one of the MOS input transistors of the end stage for small output capacities, and the MOS input transistors of the same conduction type in both of the end stages having gate terminals being connected to one another.

In accordance with a concomitant feature of the invention, the end stage for small output capacities has MOS input transistors with drain terminals, and the control stage is a control amplifier having an output connected to the drain terminal of one of the MOS input transistors of the end stage for small output capacities.

Other features which are considered as characteristic for the invention are set forth in the appended claims.

Although the invention is illustrated and described herein as embodied in a large swing buffer amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
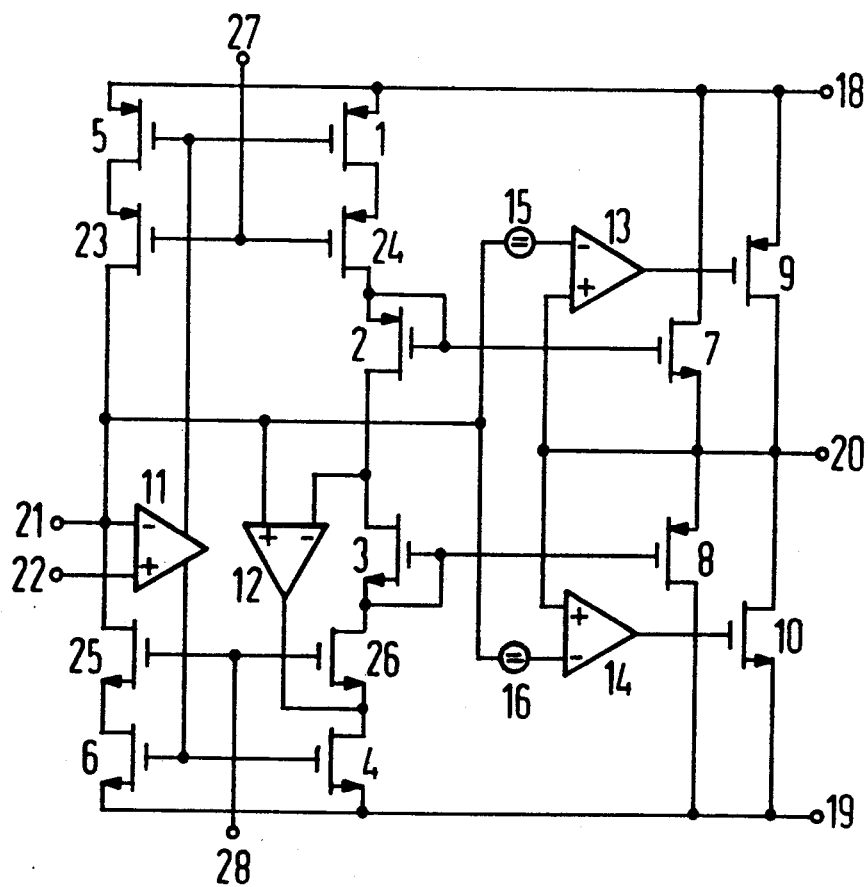

FIG. 1 is a schematic circuit diagram of a first exemplary embodiment of an output buffer amplifier according to the invention; and FIG. 2 is a circuit diagram of a second exemplary embodiment of an output buffer amplifier according to the invention.

Referring now in detail to the figures of the drawing, in which identical elements are provided with the same reference numerals, and first, particularly, to FIG. 1 thereof, there is seen an exemplary embodiment of an output buffer amplifier having one end stage for small output capacities and one end stage for large output capacities. The end stages have outputs that are connected to one another and form an output 20 of the output buffer amplifier. A control stage, which precedes the end stage for small output capacities, has one input which is triggered by a signal proportional to an input signal of the end stage for large output capacities and another input which is triggered by a signal proportional to an output signal of the end stage for small output capacities. The end stage for large output capacities includes a p-channel MOS transistor 9 having a source terminal connected to a positive supply potential 18 and a drain terminal connected to the output 20, as well as an N-channel MOS transistor 10 having a source terminal connected to a negative supply potential 19 and a drain terminal connected to the output 20. The gate terminals of these two complementary output transistors of the MOS transistors 9 and 10 are each connected to the output of a respective error or fault amplifier 13 and 14, having non-inverting inputs which are connected to one another and to the output 20. The inverting inputs of the two error amplifiers 13 and 14 are each preceded by a respective offset voltage source 15 and 16 and are connected to one another and to the inverting input of the control stage, which is constructed as a differential amplifier 12.

The end stage for small output capacities includes two complementary MOS input transistors, namely a p-channel MOS transistor 1 having a source terminal being acted upon by the positive supply potential 18, and an n-channel MOS transistor 4 having a source terminal being acted upon by the negative supply potential 19. The drain-to-source path of an n-channel MOS transistor 17 is connected parallel to the drain-to-source path of the MOS transistor 4, and the gate terminal of the MOS transistor 17 is connected to the output of the differential amplifier 12. The drain terminals of the two MOS transistors 1 and 4 are connected to one another in the conducting direction through a series circuit of two diodes. The two diodes in the exemplary embodiment shown are formed by an n-channel MOS transistor 2 having gate and drain terminals which are connected to one another and to the drain terminal of the MOS transistor 1, and by a p-channel MOS transistor 3 having gate and drain terminals which are connected to one another and to the drain terminal of the MOS transistor 4. The source terminals of the two MOS transistors 2 and 3 are coupled to one another and are connected to the non-inverting input of the control stage, that is the non-inverting input of the differential amplifier 12.

Two further complementary MOS output transistors are connected to the drain terminals of the MOS transistors 1 and 4. These two further transistors are an n-channel MOS transistor 7 having a gate terminal connected to the drain terminal of the MOS transistor 1 and a drain terminal connected to the positive supply potential 18, as well as a p-channel MOS transistor 8 having a gate terminal connected to the drain terminal of the MOS transistor 4 and a drain terminal connected to the negative supply potential 19. The source terminals of the two MOS transistors 7 and 8 are coupled to one another and form the output of the end stage for small output capacities. They are therefore also connected to the output 20.

In a further feature of the invention, a p-channel MOS transistor 5 has a drain terminal connected to the inverting input of the differential amplifier 12 and a source terminal connected to the positive supply potential 18. An n-channel MOS transistor 6 also has a source terminal connected to the negative supply potential 19 and a drain terminal connected to the inverting input of the differential amplifier 12. The gate terminal of the MOS transistor 5 is coupled to the gate terminal of the MOS transistor 1, and the gate terminal of the MOS transistor 6 is coupled to the gate terminal of the MOS transistor 4, thereby forming inputs of the output buffer amplifier. These two MOS input transistors, that is the MOS transistors 5 and 6, increase the modulability of the end stage for large output capacities. Finally, the output buffer amplifier is preceded by an input amplifier 11, which has two differential inputs 21 and 2 and two differential outputs that are connected to the gate terminals of the MOS transistors 1, 5 and 4, 6, respectively. The input amplifier 11 is provided on one hand for increasing the gain and on the other for adaptation of the impedance.

As compared with FIG. 1, the exemplary embodiment of FIG. 2 is modified in such a way that the MOS input transistors of the two end stages, that is the MOS transistors 1, 4, 5, 6, are each a component of a cascade circuit. To this end, two p-channel MOS transistors 23 and 24 having coupled gate terminals to which a bias potential 27 is applied, and two n-channel MOS transistors 25 and 26 having coupled gate terminals to which a bias potential 28 is applied, are provided. The source-to-drain paths of the transistors 23, 24, 25, 26 are each connected on the drain side in such a way as to follow a respective one of the MOS input transistors of the same conduction type. This means that the source terminals of the drain-coupled MOS transistors 23 and 25 are respectively connected to the drain terminals of the MOS transistors 5 and 6. The source-to-drain path of the MOS transistor 24 is connected between the drain terminal of the MOS transistor 1 and the source terminal of the MOS transistor 2. The source-to-drain path of the MOS transistor 26 is connected between the drain terminal of the MOS transistor 4 and the source terminal of the MOS transistor 3.

The MOS transistor 17 is also omitted in the exemplary embodiment of FIG. 2. Accordingly, the output of the differential amplifier 12 is applied directly to the drain terminal of the MOS transistor 4. In order to compensate for the phase reversal brought about by the MOS transistor 17, the inverting and non-inverting inputs of the differential amplifier 12 are transposed in the output buffer amplifier of FIG. 2 as compared with FIG. 1. Finally the two buffer amplifiers of FIG. 1 and FIG. 2 that are both operated as voltage followers operate differently in regard to the negative feedback. In accordance with FIG. 1, the feedback may be from the output 20 to one input of the input amplifier 11, which would be the inverting input in both illustrated cases, or as in FIG. 2 from the mutually coupled inverting inputs of the error amplifiers 13 and 14 to one input of the input amplifier 11. In the first case, greater linearity and in the second case greater speed and thus a higher limit frequency, are attained.

The operation of an output buffer amplifier according to the invention is based on the parallel connection of two different end stages at the output side. One end stage is provided for a small output capacity range, while the other end stage becomes active only in the event of greater output capacities. On the other hand, in order to preclude a disadvantageous behavior of this configuration resulting from inadequate synchronism of the two end stages, according to the invention a control amplifier is connected between the input of the end stage for small output capacities and the input of the end stage for large output capacities. In order to adjust the synchronism of the two end stages, a signal that is proportional to the input signal of the end stage for large output capacities and a signal that is proportional to the output signal of the end stage for small capacities is evaluated by the control amplifier. The two offset voltage sources 15 and 16 cause the end stage for larger output capacities not to become active until relatively large input signal values occur. In order to increase the modulability of the entire output buffer amplifier, the two MOS transistors 5 and 6 are additionally provided. A the input of the end stage for large output capacities, they enable a signal swing at the level of the supply voltage, in other words the difference between the positive and the negative supply potentials 18 and 19.

We claim:

1. An output buffer amplifier, comprising:
   one end stage for small output capacities having two sourcecoupled complementary MOS output transistors, one end stage for large output capacities, said end stages having outputs being connected to one another;
   a control stage connected upstream of said end stage for small output capacities, said control stage having one input being triggered by a signal proportional to an input signal of said end stage for large output capacities and another input being triggered by a signal proportional to an output signal of said end stage for small output capacities; and
   an MOS trigger transistor having a gate terminal and a drain-in-to-source path, said end stage for small output capacities having MOS input transistors with drain-to-source paths, said control stage being a control amplifier having an output coupled through said MOS trigger transistor to said end stage for small output capacities, the gate terminal of said MOS trigger transistor being connected to the output of said control amplifier and the drain-to-source path of said MOS trigger transistor being connected parallel to the drain-to-source path of one of said MOS input transistors of said end stage for small output capacities, and said MOS input transistors of the same conductivity type in both of said end stages having gate terminals being connected to one another.

2. The output buffer amplifier according to claim 1, wherein said control stage has a differential amplifier.

3. The output buffer amplifier according to claim 1, wherein said end stage for large output capacities has two drain-coupled complementary MOS output transistors with gate terminals, two fed-back error amplifiers each being connected upstream of a respective one of the gate terminals of said complementary MOS output transistors and each having inputs, and offset voltage sources each being connected upstream of a respective one of the inputs of said error amplifiers for coupling the inputs of said error amplifiers to one another.

4. The output buffer amplifier according to claim 3, wherein said end stage for large output capacities has two drain-coupled MOS input transistors with gate terminals to which an input signal is applied.

5. The output buffer amplifier according to claim 3, wherein said error amplifiers are fed-back from the coupled drain terminals of said complementary MOS output transistors to inputs of said error amplifiers.

6. The output buffer amplifier according to claim 4, wherein said error amplifiers are fed-back from the coupled drain terminals of said complementary MOS output transistors to inputs of said error amplifiers.

7. An output buffer amplifier, comprising:
   one end stage for small output capacities, one end stage for large output capacities, said end stages having outputs being connected to one another; and
   a control stage connected upstream of said end stage for small output capacities, said control stage having one input being triggered by a signal proportional to an input signal of said end stage for large output capacities and another input being triggered by a signal proportional to an output signal of said end stage for small output capacities;

said end stage for small output capacities having a series circuit of diodes with a pickup, and two complementary MOS input transistors having drain terminals being coupled in the conducting direction through said series circuit of diodes and gate terminals to which an input signal is applied, and the pickup of said series circuit of diodes carrying a signal proportional to an output signal of said end stage for small output capacities;

an MOS trigger transistor having a gate terminal and a drain-to-source path, said end stage for small output capacities having MOS input transistors with drain-to-source paths, said control stage being a control amplifier having an output coupled through said MOS trigger transistor to said end stage for small output capacities, the gate terminal of said MOS trigger transistor being connected to the output of said control amplifier and the drain-to-source path of said MOS trigger transistor being connected parallel to the drain-to-source path of one of said MOS input transistors of said end stage for small output capacities, and said MOS input transistors of the same conductivity type in both of said end stages having gate terminals being connected to one another.

8. An output buffer amplifier, comprising:

one end stage for small output capacities, one end stage for large output capacities, said end stages having outputs being connected to one another;

a control stage connected upstream of said end stage for small output capacities, said control stage having one input being triggered by a signal proportional to an input signal of said end stage for large output capacities and another input being triggered by a signal proportional to an output signal of aid end stage for small output capacities;

complementary MOS input transistors having drain terminals, and additional MOS transistors each being connected to the drain terminal of a respective one of said MOS input transistors of the same conductivity type, forming cascade stages, said additional MOS transistors having gate terminals connected to bias potentials; and an MOS trigger transistor having a gate terminal and a drain-to-source path, said end stage for small output capacities having MOS input transistors with drain-to-source paths, said control stage being a control amplifier having an output coupled through said MOS trigger transistor to said end stage for small output capacities, the gate terminal of said MOS trigger transistor being connected to the output of said control amplifier and the drain-to-source path of said MOS trigger transistor being connected parallel to the drain-to-source path of one of said MOS input transistors of said end stage for small output capacities, and said MOS input transistors of the same conductivity type in both of said end stages having gate terminals being connected to one another.

9. The output buffer amplifier according to claim 1, wherein said MOS input transistors of said end stage for small output capacities have drain terminals, and said control amplifier has an output connected to the drain terminal of one of said MOS input transistors of said end stage for small output capacities.

10. The output buffer amplifier according to claim 7, wherein said MOS input transistors of said end stage for small output capacities have drain terminals, and said control amplifier has an output connected to the drain terminal of one of said MOS input transistors of said end stage for small output capacities.

11. The output buffer amplifier according to claim 8, wherein said MOS input transistors of said end stage for small output capacities have drain terminals, and said control amplifier has an output connected to the drain terminal of one of said MOS input transistors of said end stage for small output capacities.

12. The output buffer amplifier according to claim 7, wherein said control amplifier is a differential amplifier.

13. The output buffer amplifier according to claim 7, wherein said end stage for large output capacities has two drain-coupled complementary MOS output transistors with gate terminals, two fed-back error amplifiers each being connected upstream of a respective one of the gate terminals of said complementary MOS output transistors and each having inputs, and offset voltage sources each being connected upstream of a respective one of the inputs of said error amplifiers for coupling the inputs of said error amplifiers to one another.

14. The output buffer amplifier according to claim 13, wherein said end stage for large output capacities has two drain-coupled MOS input transistors with gate terminals to which an input signal is applied.

15. The output buffer amplifier according to claim 13, wherein said error amplifiers are fed-back from the coupled drain terminals of said complementary MOS output transistors to inputs of said error amplifiers.

16. The output buffer amplifier according to claim 8, wherein said control amplifier is a differential amplifier.

17. The output buffer amplifier according to claim 8, wherein said end stage for large output capacities has two drain-coupled complementary MOS output transistors with gate terminals, two fed-back error amplifiers each being connected upstream of a respective one of the gate terminals of said complementary MOS output transistors and each having inputs, and offset voltage sources each being connected upstream of a respective one of the inputs of said error amplifiers for coupling the inputs of said error amplifiers to one another.

18. The output buffer amplifier according to claim 17, wherein said end stage for large output capacities has two drain-coupled MOS input transistors with gate terminals to which an input signal is applied.

19. The output buffer amplifier according to claim 17, wherein said error amplifiers are fed-back from the coupled drain terminals of said complementary MOS output transistors to inputs of said error amplifiers.

20. An output buffer amplifier, comprising:

one end stage for small output capacities having two source-coupled complementary MOS output transistors, one end stage for large output capacities, said end stages having outputs connected to one another;

complementary MOS input transistors having drain terminals, and additional MOS transistors each being connected to the drain terminal of a respective one of said MOS input transistors of the same conductivity type, forming cascade stages, said additional MOS transistors having gate terminals connected to bias potentials; and a control stage connected upstream of said end stage for small output capacities, said control stage having one input being triggered by a signal proportional to an input signal of said end stage for large output capacities and another input being triggered by a signal proportional to an output signal of said end stage for small output capacities, and said control stage having an output connected to the drain terminal of one of said MOS input transistors and an associated one of said additional MOS transistors.

21. The output buffer amplifier according to claim 20, wherein said control stage has a control amplifier.

22. The output buffer amplifier according to claim 20, wherein said end stage for large output capacities has two drain-coupled complementary MOS output transistors with gate terminals, two fed-back error amplifiers each being connected upstream of a respective one of the gate terminals of said complementary MOS output transistors and each having inputs, and offset voltage sources each being connected upstream of a respective one of the inputs of said error amplifiers for coupling the inputs of said error amplifiers to one another.

23. The output buffer amplifier according to claim 22, wherein said error amplifiers are fed-back from the coupled drain terminals of said complementary MOS output transistors to inputs of said error amplifiers.

* * * * *